(12) United States Patent
Galloway

(10) Patent No.: US 7,102,401 B2
(45) Date of Patent: Sep. 5, 2006

(54) MEASURING THE 3 DB FREQUENCY BANDWIDTH OF A PHASE-LOCKED LOOP

(75) Inventor: Brian Jeffrey Galloway, Campbell, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 16 days.

(21) Appl. No.: 10/999,359

(22) Filed: Nov. 30, 2004

(65) Prior Publication Data
US 2006/0114038 A1 Jun. 1, 2006

(51) Int. Cl.
*H03L 7/00* (2006.01)
*H03L 7/06* (2006.01)

(52) U.S. Cl. .......................... 327/157; 331/16
(58) Field of Classification Search ........ 327/156–159, 327/147–148; 331/16
See application file for complete search history.

(56) References Cited

U.S. PATENT DOCUMENTS 5,764,598 A * 6/1998 Okayasu ................. 368/120
6,557,416 B1 * 5/2003 Chang et al. ............... 73/579
2005/0068111 A1 * 3/2005 Kasahara et al. ........... 331/16

OTHER PUBLICATIONS

Burbidge, Martin John, Tijou, Jim, Richardson, Andrew, "Techniques for Automatic On Chip Closed Loop Transfer Function Monitoring For Embedded Charge Pump Phase Locked Loop", IEEE, 1530-1591/Mar. 2003.
Greshishchev, Yuriy, "SiGe Clock and Data Recovery IC with Linear-Type PLL for 10-Gb/s SONET Application" IEEE Journal of Solid-state Circuits, vol. 35, No. 9, Sep. 2000.
Hajimiri, Ali, "Noise in Phase-Locked Loops [Invited]" IEEE, 0-7803-6742-1/01, 2001.

* cited by examiner

*Primary Examiner*—Dinh T. Le

(57) ABSTRACT

The 3 dB frequency bandwidth of a phase-locked loop (PLL) is determined by measuring the frequency of a voltage controlled oscillator (VCO) signal when an up charging current is applied, measuring the frequency of the VCO signal when a down charging current is applied, and then using the two frequency measurements to calculate the 3 dB frequency bandwidth of the PLL. The up and down charging currents can be applied through a charge current switch system and the frequency measurements can be made with a frequency counter, both of which are monolithically integrated with the PLL. The technique for measuring the 3 dB frequency bandwidth can be applied to a first order or a second PLL. When applied to a second order PLL, the technique includes an initial frequency centering operation.

19 Claims, 10 Drawing Sheets

MEASURING THE 3 DB FREQUENCY BANDWIDTH OF A PHASE-LOCKED LOOP

BACKGROUND OF THE INVENTION

Phase-locked loops (PLLs) are used in data communications and telecommunications applications to lock onto the frequency and phase of a signal. In particular, PLLs are often used in clock and data recovery (CDR) applications. A typical PLL includes a phase detector, a charge pump, a loop filter, and a voltage controlled oscillator (VCO) that produces a VCO signal. One performance characteristic of a PLL is the 3 decibel (dB) frequency bandwidth. The 3 dB frequency bandwidth is a measure of the frequency bandwidth within which the PLL is able to track frequency changes of the input signal. The 3 dB frequency bandwidth is usually measured directly by phase modulating the input signal and observing the amplitude of the resulting output signal. The frequency at which the ratio of the input signal phase to the output signal phase ($\theta_{out}/\theta_{in}$, commonly known as the closed loop transfer function), drops from unity to −3 dB identifies the 3 dB frequency bandwidth. This technique for measuring the 3 dB frequency bandwidth requires a data source with a phase modulated clock to provide the phase modulated input signal and an external spectrum analyzer to measure the amplitude of the phase modulated output signal. Although this technique works well, the phase modulated clock and external spectrum analyzer add complexity and cost to the 3-dB frequency measurement.

In view of the above, what is needed is a technique for measuring the 3 dB frequency bandwidth of a PLL that is easy to use and cost effective to implement.

SUMMARY OF THE INVENTION

The 3 dB frequency bandwidth ($f_{3\ dB}$) of a PLL is determined by measuring the frequency of a VCO signal when an up charging current is applied, measuring the frequency of the VCO signal when a down charging current is applied, and then using the two frequency measurements to calculate the 3 dB frequency bandwidth of the PLL. In an embodiment, the up and down charging currents are applied through a charge current switch system and the frequency measurements are made with a frequency counter. Both the charge current switch system and the frequency counter are simpler and less expensive components than the phase modulator and the spectrum analyzer that are required by other known techniques for measuring the 3 dB frequency bandwidth. Additionally, the charge current switch system and the frequency counter can be monolithically integrated with the PLL. That is, the functionality needed to support the 3 dB frequency bandwidth measurement can be included "on-chip" with the PLL. Including the switching and frequency counting functionality on-chip is relatively inexpensive and allows for relatively simple testing procedures.

In an example operation, the up charging current is applied to the loop filter by opening a down switch of the charge current switch system to isolate a down charge current source from the loop filter. With the down charge current source isolated and the up charging current applied to the loop filter, the VCO tuning voltage is maximized and the up frequency is produced. After the up frequency is measured, the down charging current is applied to the loop filter by opening an up switch of the charge current switch system to isolate an up charge current source from the loop filter. With the up charge current source isolated and the down charging current applied to the loop filter, the VCO tuning voltage is minimized and the down frequency is produced. The 3 dB frequency bandwidth is determined using the up and down frequency measurements.

The technique for measuring the 3 dB frequency bandwidth can be applied to a first order or a second PLL. When applied to a second order PLL, the technique includes an initial frequency centering operation.

Other aspects and advantages of the present invention will become apparent from the following detailed description, taken in conjunction with the accompanying drawings, illustrating by way of example the principles of the invention.

BRIEF DESCRIPTION OF THE DRAWINGS

Throughout the description similar reference numbers are used to identify similar elements.

DETAILED DESCRIPTION

The task of a phase-locked loop (PLL) is to lock the phase and frequency of a voltage controlled oscillator (VCO) signal to a particular signal, referred to herein as an input signal. In accordance with the invention, the 3 dB frequency bandwidth of a PLL is determined by measuring the frequency of the VCO signal when an up charging current is applied, measuring the frequency of the VCO signal when a down charging current is applied, and then using the two frequency measurements to calculate the 3 dB frequency bandwidth of the PLL.

Figure 1:
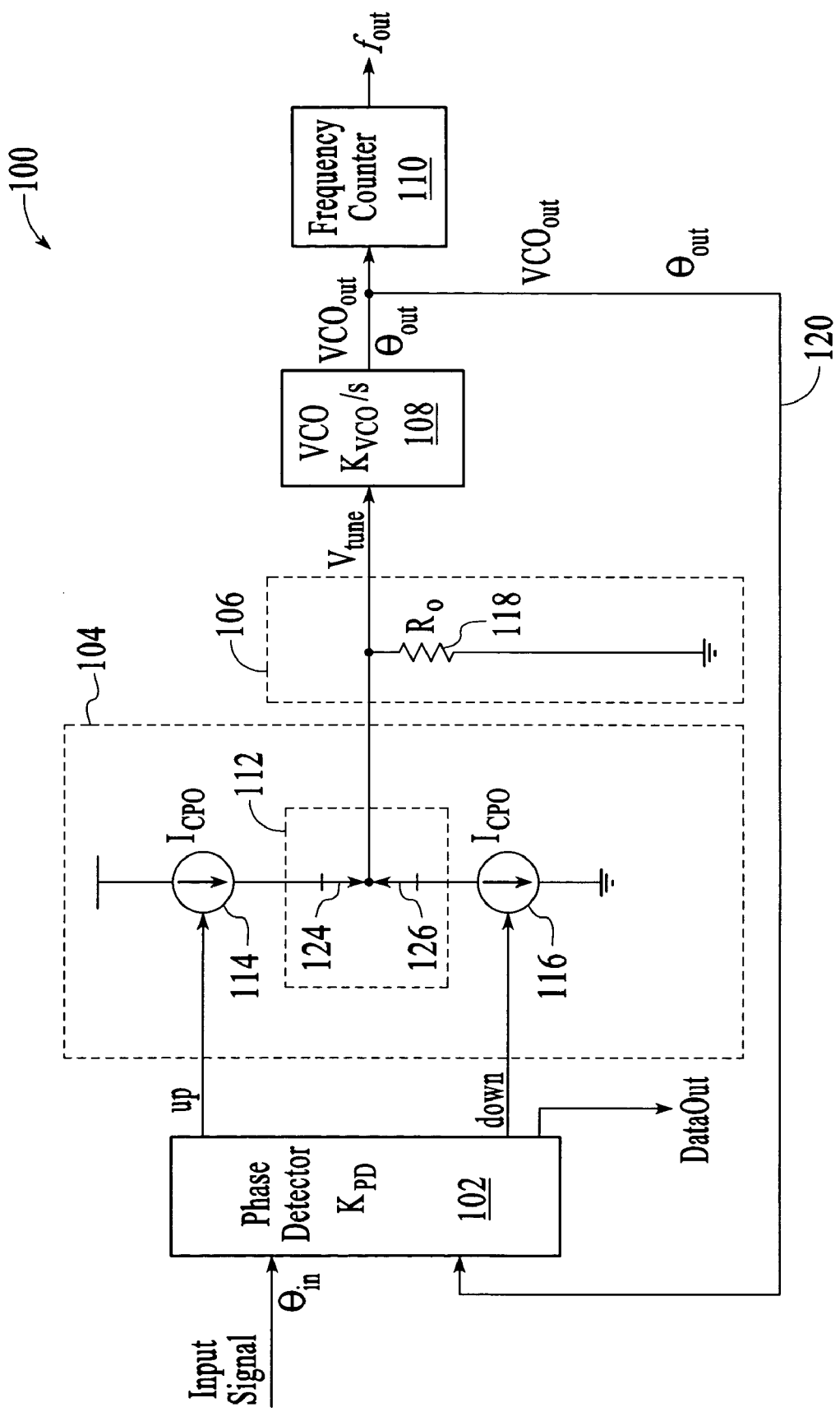
FIG. 1 depicts a first order PLL that includes a frequency counter and a charge current switch system that support the measurement of the 3 dB frequency bandwidth of the PLL in accordance with an embodiment of the invention.

FIG. 1 depicts an embodiment of a first order PLL 100 that includes a phase detector 102, a charge pump 104, a loop filter 106, and a VCO 108. FIG. 1 also depicts a frequency counter 110 and a charge current switch system 112 that support the measurement of the 3 dB frequency bandwidth of the PLL. The frequency counter and charge current switch system are described in more detail below after a description of the PLL components and operation.

The phase detector 102 is connected to receive an input signal from a signal source (not shown) and a portion of the VCO signal ($VCO_{out}$) from the VCO 108. The input signal carries clock information and data that is to be recovered. As part of the PLL operation, the phase detector compares transitions of the input signal with transitions of the VCO signal and generates an output (either an up or a down signal) that indicates the phase difference between the input signal and the VCO signal. The phase detector produces an "up" signal when the phase of the input signal leads the phase of the VCO signal and a "down" signal when the phase of the input signal lags the phase of the VCO signal. The up signal drives the frequency of the VCO signal upward while the down signal drives the frequency of the VCO signal downward, thereby advancing or retarding, respectively, the phase of the VCO signal. The phase detector also outputs recovered data (DataOut). The recovered data is not critical to the invention and is not described further.

The output from the phase detector 102 (either the up or down signal) is provided to the charge pump 104. The charge pump includes an up charge current source 114 that provides a positive charging current to the loop filter 106 in response to an up signal from the phase detector and a down charge current source 116 that provides a negative charging current to the loop filter in response to a down signal from the phase detector. The charging current that is output from the charge pump is proportional to the phase error between the input signal and the VCO signal. In particular, the charging current is equal to: phase error in radians x $I_{CPO}$/$2\pi$, where $I_{CPO}$ is the maximum charging current from the current source. The sign of the charging current depends on the sign of the phase error. In the example of FIG. 1, a phase error of $\pi$ radians results in a charging current of $I_{CPO}$/2 and a phase error of $-\pi$ radians results in a charging current of $-I_{CPO}$/2. The loop filter includes a resistance ($R_0$) that is represented by a resistor 118. A VCO tuning signal (referred to in the figures as $V_{tune}$) is generated at the loop filter in response to the output from the charge pump. In general, when a positive charging current is provided by the charge pump, the VCO tuning signal ($V_{tune}$) is increased, thereby causing the frequency of the VCO signal to increase. Conversely, when a negative charging current is provided by the charge pump, the VCO tuning signal ($V_{tune}$) is decreased, thereby causing the frequency of the VCO signal to decrease.

Operation of the first order PLL 100 depicted in FIG. 1 involves tuning the VCO 108 in response to continuous feedback from the phase detector 102. Starting at the VCO for description purposes, the VCO receives the VCO tuning signal ($V_{tune}$) from the loop filter 106 and produces a VCO signal ($VCO_{out}$) as an output. A portion of the VCO signal ($VCO_{out}$) is fed back into the phase detector as indicated by feedback connection 120. The phase detector compares the phase of the input signal to the phase of the VCO signal and generates an output signal (either an up or a down signal) in response to the VCO signal. The output signal from the phase detector is used to continually adjust the VCO tuning signal ($V_{tune}$) and as a result the frequency of the VCO.

The following description sets out supporting principles related to the technique for measuring the 3 dB frequency bandwidth of a PLL. Referring to FIG. 1, the phase of the input signal is referred to herein as $\theta_{in}$ and the phase of the VCO signal ($VCO_{out}$) is referred to herein as $\theta_{out}$. Solving the loop equation to determine the closed loop transfer function of the PLL 100 yields:

$$\frac{\theta_{out}}{\theta_{in}} = \frac{1}{\frac{s}{K_{PD}H(s)K_{VCO}} + 1} \quad (1)$$

where $K_{PD}$ is the phase detector gain, H(s) is the loop filter function, $K_{VCO}$ is the VCO gain, and $s=j\omega$. Equation (1) represents a simple low-pass filter with the 3 dB bandwidth being expressed in radian frequency as $\omega_{3\ dB}=K_{PD}H(s)K_{VCO}$.

The closed loop transfer function between the phase error and the VCO 108 for the charge pump 104 can be reduced to $I_{CPO}R_0$, where $I_{CPO}$ is the charging current for $2\pi$ radians of phase error. For the charge pump implementation of FIG. 1, the closed loop transfer function becomes:

$$\frac{\theta_{out}}{\theta_{in}} = \frac{1}{\frac{s}{I_{CPO}R_0K_{VCO}} + 1} \quad (2)$$

Since this is a simple low-pass filter, the 3 dB bandwidth of the PLL can be expressed in terms of radians as $\omega_{3\ dB}=I_{CPO}R_0K_{VCO}$, and the 3 dB bandwidth can be expressed in terms of frequency as:

$$f_{3dB} = \frac{I_{CPO}R_0K_{VCO}}{2\pi} \quad (3)$$

PLLs that are used in clock and data recovery (CDR) applications operate on data and therefore the transition density of the data has to be taken into account in a measurement of the 3 dB frequency bandwidth. Because the phase detector can only produce useful information when a transition is present in the input signal, the gain of the phase detector is proportional to the transition density factor, DF, of the input signal. For a PLL that is used in a CDR application, the closed loop transfer function can be expressed as:

$$\frac{\theta_{out}}{\theta_{in}} = \frac{1}{\frac{s}{DF \times I_{CPO}R_0K_{VCO}} + 1} \quad (4)$$

and the 3 dB frequency bandwidth can be express as:

$$f_{3dB} = \frac{DF \times I_{CPO}R_0K_{VCO}}{2\pi} \quad (5)$$

As described below, equation (5) is further simplified to express the 3 dB frequency bandwidth ($f_{3\ dB}$) in terms of up and down frequency measurements.

Referring to FIG. 1, the frequency counter 110 is configured to count the frequency of the VCO signal that is output from the VCO 108. The frequency counter generates frequency information that indicates the output frequency ($f_{out}$)

of the VCO signal (VCO$_{out}$). The charge current switch system of the charge pump is configured to allow the up and down charging currents to be applied separately to the loop filter 106 to set the VCO tuning voltage to maximum and minimum values. The charge current switch system includes an up switch 124 that allows the up current source 114 to be isolated from the loop filter and a down switch 126 that allows the down current source 116 to be isolated from the loop filter.

Figure 2:
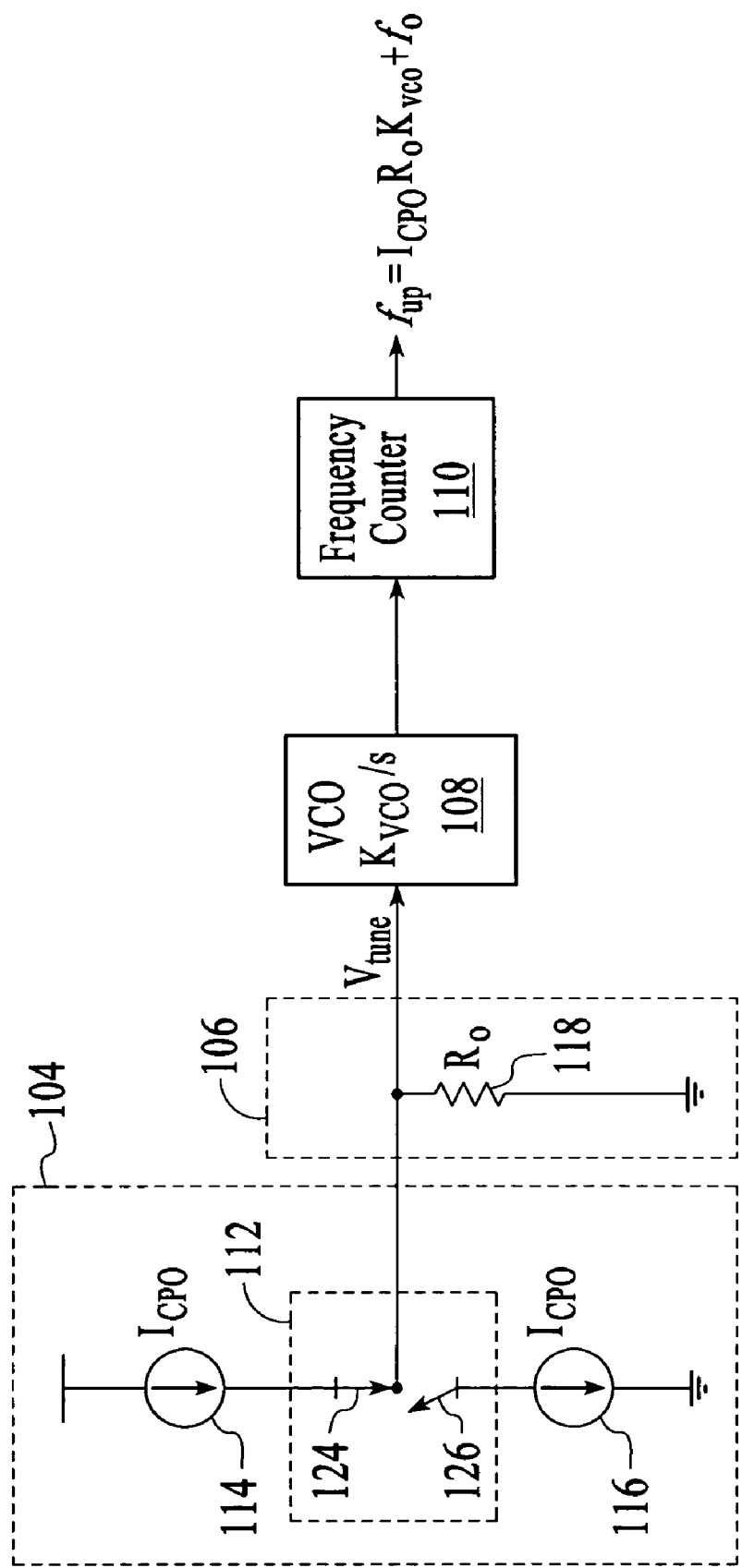
FIG. 2 depicts the charge current switch system of the PLL from FIG. 1 configured to apply an up charging current to the loop filter.

Referring to FIG. 2, with the down switch 126 open and the up switch 124 closed, the down charge current source 116 is isolated from the loop filter 106 and the up charging current ($I_{CPO}$) is applied to the loop filter. The frequency of the VCO signal with the up charging current applied to the loop filter is referred to as the "up frequency." The up frequency is the maximum frequency of the VCO signal and can be expressed as:

$$f_{up} = I_{CPO} R_0 K_{VCO} + f_0 \quad (6)$$

where $f_0$ is the center frequency of the PLL.

Figure 3:
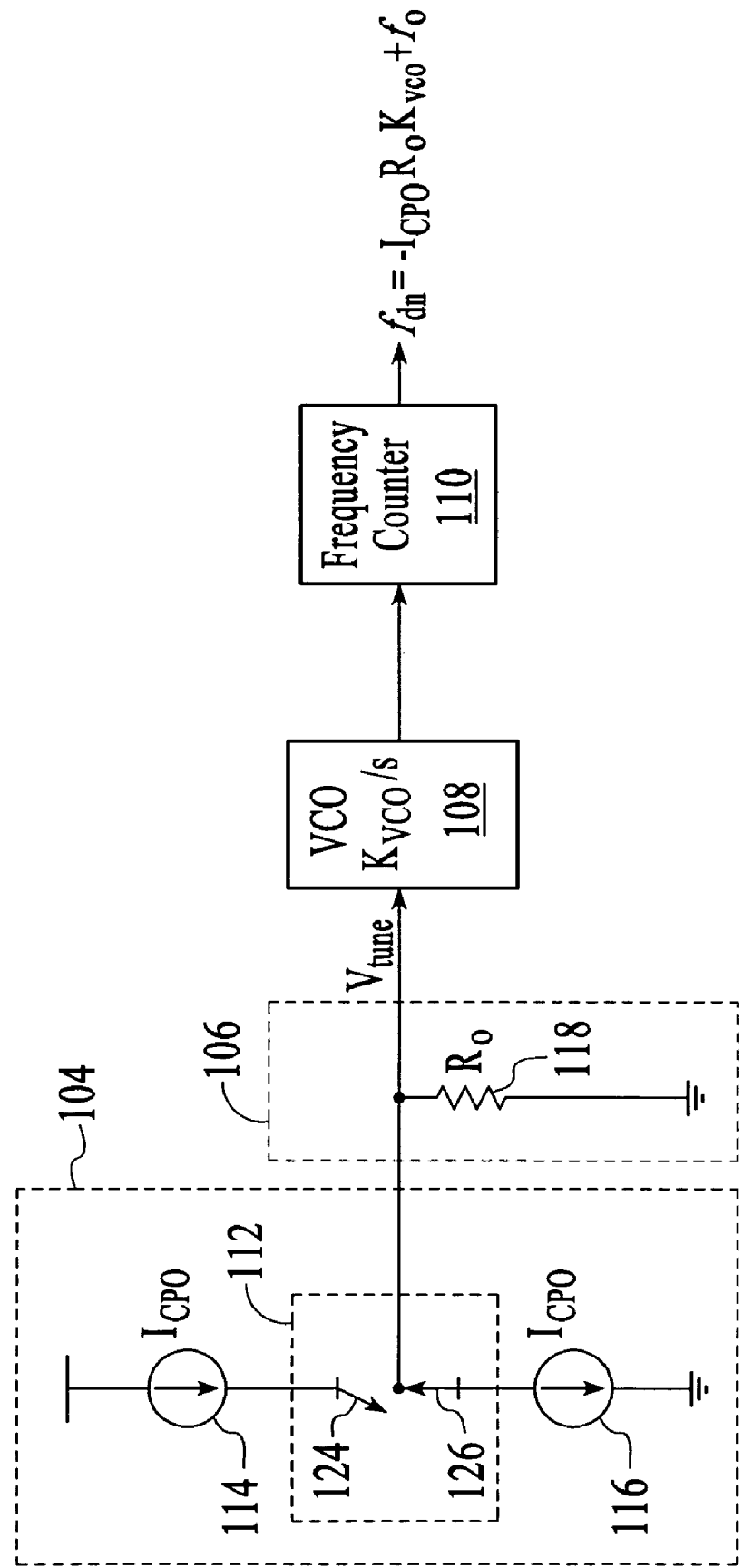
FIG. 3 depicts the charge current switch system of the PLL from FIG. 1 configured to apply a down charging current to the loop filter.

Referring to FIG. 3, with the up switch 124 open and the down switch 126 closed, the up charge current source 114 is isolated from the loop filter 106 and the down charging current ($-I_{CPO}$) is applied to the loop filter. The frequency of the VCO with the down charging current applied to the loop filter is referred to as the "down frequency." The down frequency is the minimum frequency of the VCO signal and can be expressed as:

$$f_{dn} = -I_{CPO} R_0 K_{VCO} + f_0 \quad (7)$$

A comparison of equations (6) and (7) results in the expression:

$$f_{up} - f_{dn} = 2 \times I_{CPO} R_0 K_{VCO} \quad (8)$$

Solving equation (8) for $I_{CPO} R_0 K_{VCO}$ and substituting the expression into equation (5) from above yields the following expression for the 3 dB frequency bandwidth:

$$f_{3dB} = \frac{f_{up} - f_{dn}}{4\pi} \times DF \quad (9)$$

Given equation (9) and in accordance with the invention, the 3 dB frequency bandwidth ($f_{3\ dB}$) of a PLL is determined by measuring the frequency of the VCO signal when an up charging current is applied, measuring the frequency of the VCO signal when a down charging current is applied, and then using the two frequency measurements to calculate the 3 dB frequency bandwidth of the PLL. The 3 dB frequency bandwidth is calculated by applying the two frequency measurements along with the transition density factor of the input signal to equation (9) and solving for $f_{3\ dB}$.

An example operation of the technique for determining the 3 dB frequency bandwidth of the PLL 100 from FIG. 1 is described with reference to FIGS. 2–3. Referring to FIG. 2, the up frequency is produced by applying an up charging current to the loop filter 106 of the PLL. The up charging current is applied to the loop filter by opening the down switch 126 and closing the up switch 124 of the charge current switch system 112 to isolate the down charge current source 116 from the loop filter. With the down charge current source isolated and the up charging current applied to the loop filter, the VCO tuning voltage ($V_{tune}$) is maximized and the up frequency ($f_{up}$) is produced. The up frequency of the VCO signal is then measured by the frequency counter 110. Once the up frequency is measured, the down frequency is produced by applying a down charging current to the loop filter of the PLL. Referring to FIG. 3, the down charging current is applied to the loop filter by opening the up switch and closing the down switch of the charge current switch system to isolate the up charge current source from the loop filter. With the up charge current source isolated and the down charging current applied to the loop filter, the VCO tuning voltage ($V_{tune}$) is minimized and the down frequency ($f_{dn}$) is produced. The down frequency of the VCO signal is then measured by the frequency counter and the 3 dB frequency bandwidth is determined by applying the up and down frequency measurements along with the transition density factor of the input signal to equation (9) and solving for $f_{3\ dB}$.

As described herein, the 3 dB frequency bandwidth is measured using a charge current switch system 112 and a frequency counter 110. Both the charge current switch system and the frequency counter are simpler and less expensive components than the phase modulator and the spectrum analyzer that are required by other known techniques for measuring the 3 dB frequency bandwidth. Additionally, the charge current switch system and the frequency counter can be monolithically integrated with the PLL. That is, the functionality needed to support the 3 dB frequency bandwidth measurement can be included "on-chip" with the PLL. Including the switching and frequency counting functionality on-chip is relatively inexpensive and allows for simpler testing procedures.

Figure 4:
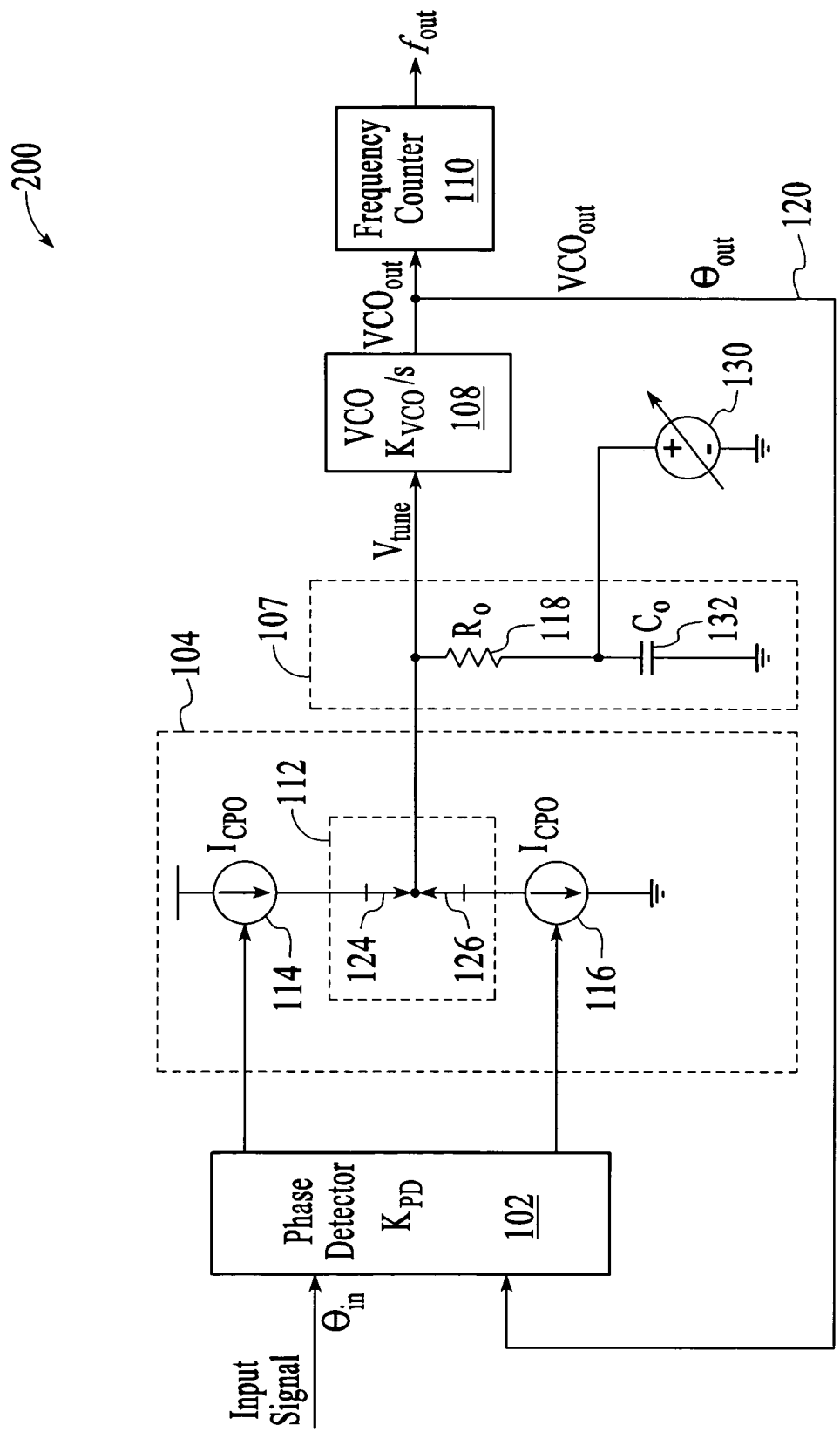
FIG. 4 depicts a second order PLL that includes a charge current switch system, a frequency counter, and a voltage controller that support the measurement of the 3-dB frequency bandwidth of the PLL.

The technique for measuring the 3 dB frequency bandwidth is described above with reference to a first order PLL 100. A similar technique can be applied to a second order PLL. A second order PLL is similar to a first order PLL except that the loop filter includes a capacitor that when combined with the charge pump provides an extra integration in the PLL. FIG. 4 depicts an embodiment of a second order PLL 200 that includes a loop filter 107 with a capacitor 132 connected in series with the resistor, $R_0$, 118. The PLL also includes a charge current switch system 112, a frequency counter 110, and a tuning voltage source 130 for measuring the 3-dB frequency bandwidth of the PLL. The tuning voltage source 130 is configured to allow external control of the VCO tuning voltage ($V_{tune}$).

Referring to FIG. 4, the capacitor 132 of the loop filter 107 turns the charge pump 104 into an integrator at low frequencies with a zero at $f_z = 1/2\pi R_0 C_0$ and a time constant $\tau_z = R_0 C_0$. The PLL 200 becomes increasingly stable the farther $f_z$ is below the 3 dB frequency bandwidth. The closed loop transfer function of the second order PLL can be expressed as:

$$\frac{\theta_{out}}{\theta_{in}} = \frac{\tau_z K_{PD} K_{VCO} s + K_{PD} K_{VCO}}{s^2 + \tau_z K_{PD} K_{VCO} s + K_{PD} K_{VCO}} \quad (10)$$

with the phase detector gain expressed as:

$$K_{PD} = \frac{I_{CPO}}{C_0} \times DF \quad (11)$$

This equation for the closed loop transfer function fits the standard formula for a second order PLL closed loop transfer function with a charge pump. The natural radian frequency of the PLL can be expressed as:

$$\omega_n = \sqrt{K_{VCO}\frac{I_{CPO}DF}{C_0}} \qquad (12)$$

The stability can be found as:

$$\zeta = \frac{R_0 C_0 \omega_n}{2} \qquad (13)$$

The ratio of the 3 dB radian frequency to the natural frequency can be expressed as:

$$\frac{\omega_{3dB}}{\omega_n} = \sqrt{2\zeta^2 + 1 + \sqrt{(2\zeta^2 + 1)^2 + 1}} \qquad (14)$$

For high stability, the ratio of the 3 dB radian frequency to the natural frequency can be approximated as:

$$\frac{\omega_{3dB}}{\omega_n} = 2\zeta \qquad (15)$$

Using this approximation and solving for $f_{3\ dB}$ results in equation (5) from above.

Figure 5:
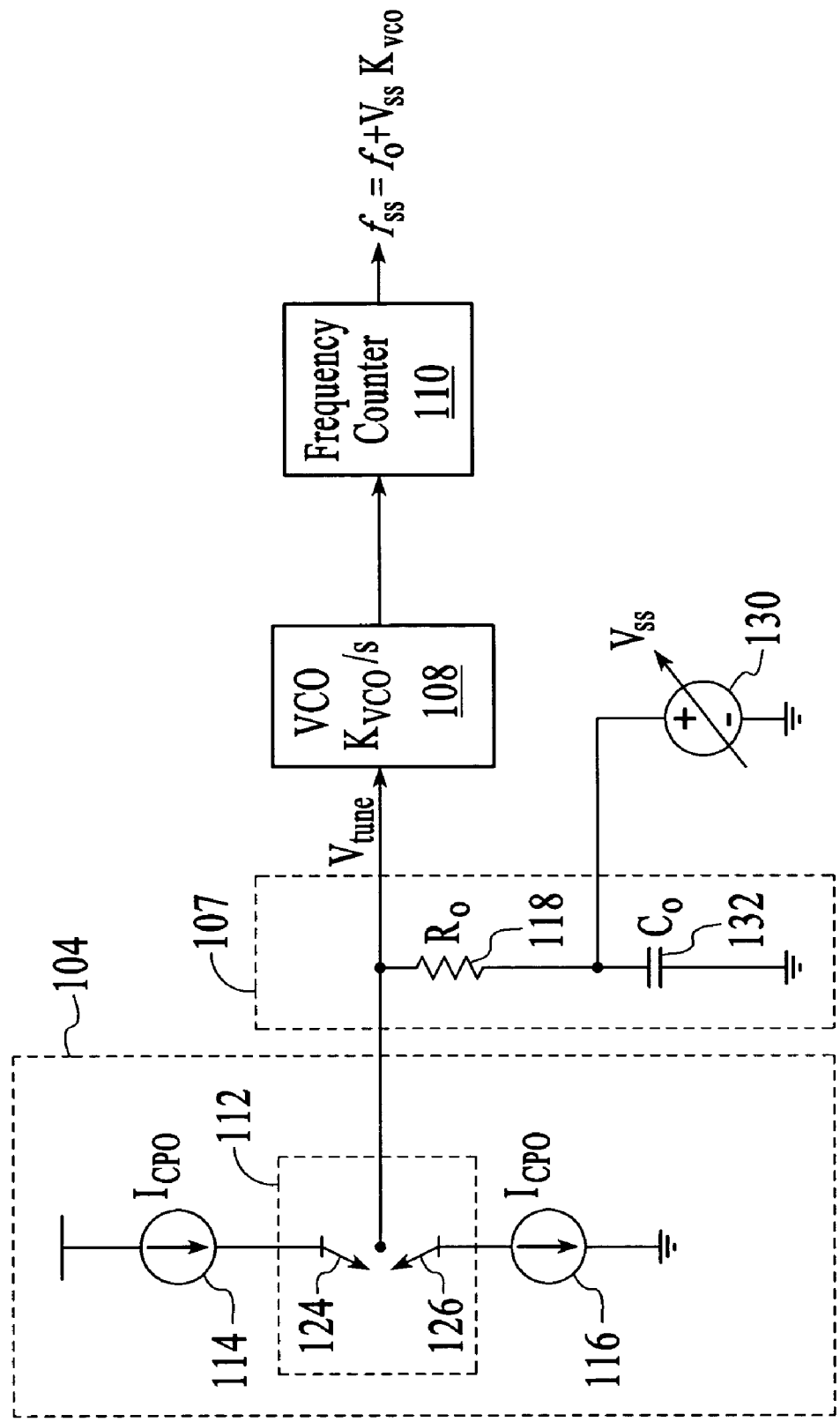
FIG. 5 depicts the charge current switch system of the PLL from FIG. 4 configured to allow the loop filter capacitor voltage to be set by the voltage controller.

Given equation (5), a technique that is similar to the first order PLL technique can be used to determine the 3 dB frequency bandwidth of a second order PLL. One problem with a second order PLL is that the VCO gain ($K_{VCO}$) can vary wildly over the VCO tuning voltage ($V_{tune}$). Therefore, in an embodiment, the 3 dB frequency bandwidth measurement is started by adjusting the center frequency of the PLL to a desired steady state frequency. Referring to FIG. 5, the center frequency of the PLL can be adjusted to the desired steady state frequency by disconnecting the charge pump 104 using the charge current switch system 112 (e.g., by opening both the up and down switches 124 and 126) and then adjusting the loop filter capacitor voltage to a steady state voltage ($V_{ss}$) using the tuning voltage source 130 so that the VCO 108 operates at the desired steady state frequency. As depicted in FIG. 5, with the steady state voltage ($V_{ss}$) applied, the steady state frequency of the PLL is a function of the steady state voltage ($V_{ss}$), the gain of the VCO ($K_{VCO}$), and the center frequency of the PLL ($f_0$), such that $f_{ss} = f_0 + V_{ss} K_{VCO}$.

Figure 6:
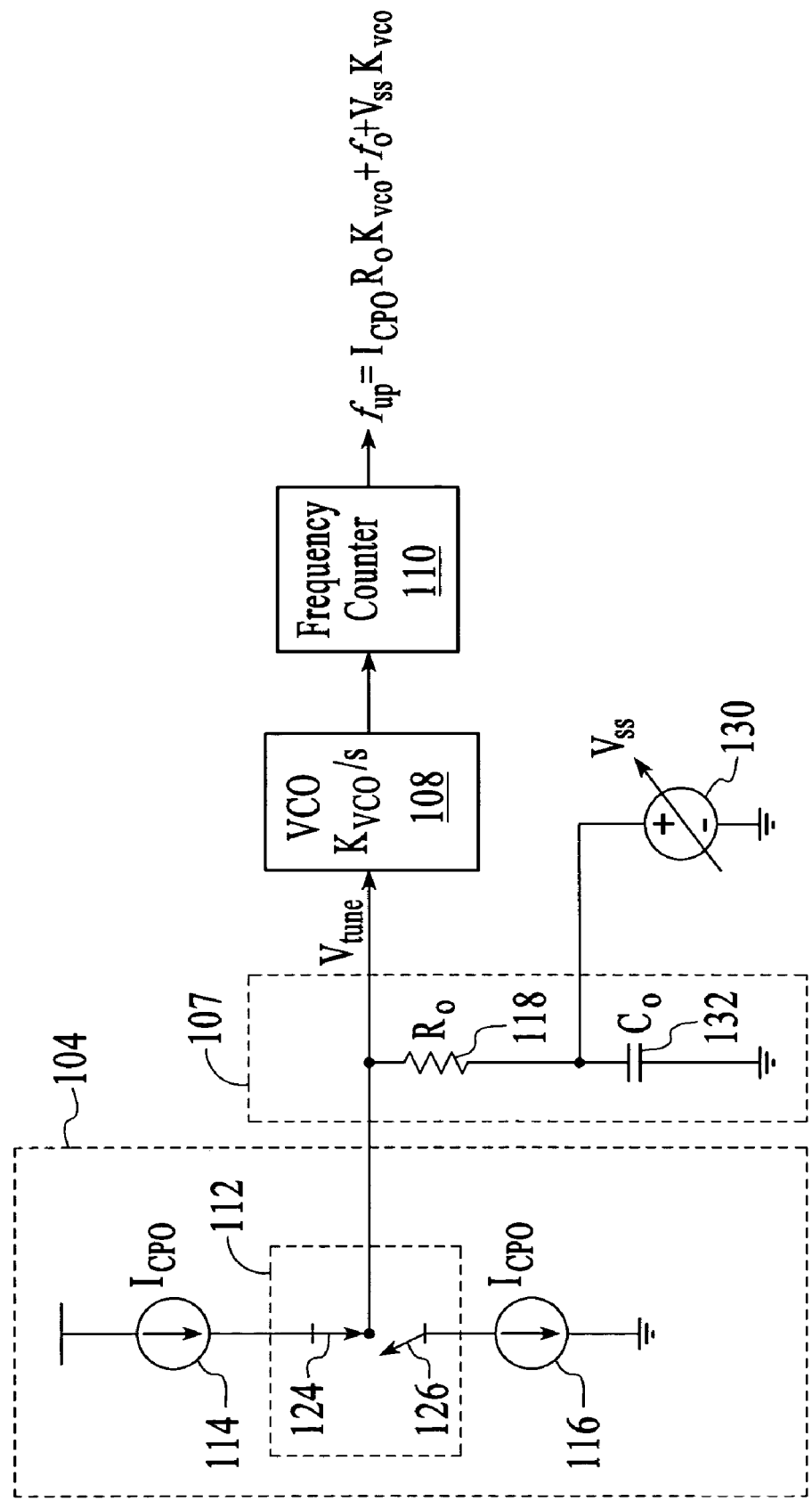
FIG. 6 depicts the charge current switch system of the PLL from FIG. 4 configured to apply an up charging current to the loop filter.
Figure 7:
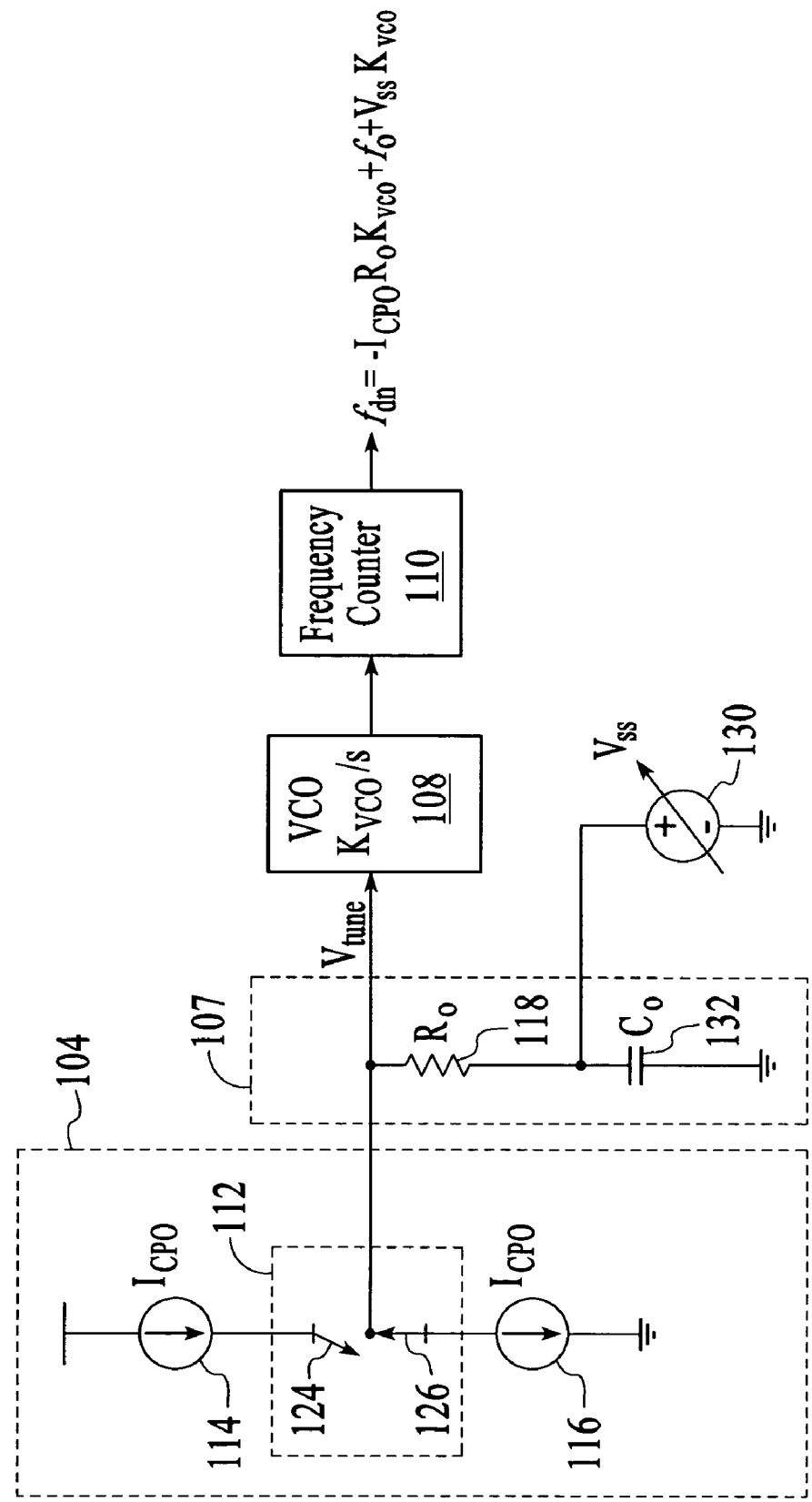
FIG. 7 depicts the charge current switch system of the PLL from FIG. 4 configured to apply a down charging current to the loop filter.

Once the steady state frequency ($f_{ss}$) of the VCO 108 is set, the 3 dB frequency bandwidth is determined as described with reference to FIGS. 6 and 7. Referring to FIG. 6, the up frequency is produced by applying an up charging current ($I_{CPO}$) to the loop filter 107 of the PLL. The up charging current is applied to the loop filter by opening the down switch 126 and closing the up switch 124 of the charge current switch system 112 to isolate the down charge current source 116 from the loop filter. With the down charge current source isolated and the up charging current ($I_{CPO}$) applied to the loop filter, the VCO tuning voltage ($V_{tune}$) is maximized and the up frequency is produced. As depicted in FIG. 6, the up frequency can be expressed as:

$$f_{up} = I_{CPO} R_0 K_{VCO} + f_0 + V_{ss} K_{VCO} \qquad (16)$$

The up frequency of the VCO signal is then measured by the frequency counter 110. Once the up frequency is measured, the down frequency is produced by applying a down charging current ($-I_{CPO}$) to the loop filter of the PLL. Referring to FIG. 7, the down charging current is applied to the loop filter by opening the up switch and closing the down switch of the charge current switch system to isolate the up charge current source 114 from the loop filter. With the up charge current source isolated and the down charging current ($-I_{CPO}$) applied to the loop filter, the VCO tuning voltage ($V_{tune}$) is minimized and the down frequency is produced. As depicted in FIG. 7, the down frequency can be expressed as:

$$f_{dn} = -I_{CPO} R_0 K_{VCO} + f_0 + V_{ss} K_{VCO} \qquad (17)$$

The down frequency of the VCO signal is then measured by the frequency counter.

A comparison of equations (16) and (17) again results in equation (8) from above. Solving equation (8) for $I_{CPO} R_0 K_{VCO}$ and substituting the expression into equation (5) yields equation (9). Therefore, the 3 dB frequency bandwidth for a second order PLL is determined by applying the up and down frequency measurements to equation (9) along with the transition density factor of the input signal and solving for $f_{3\ dB}$.

Figure 8:
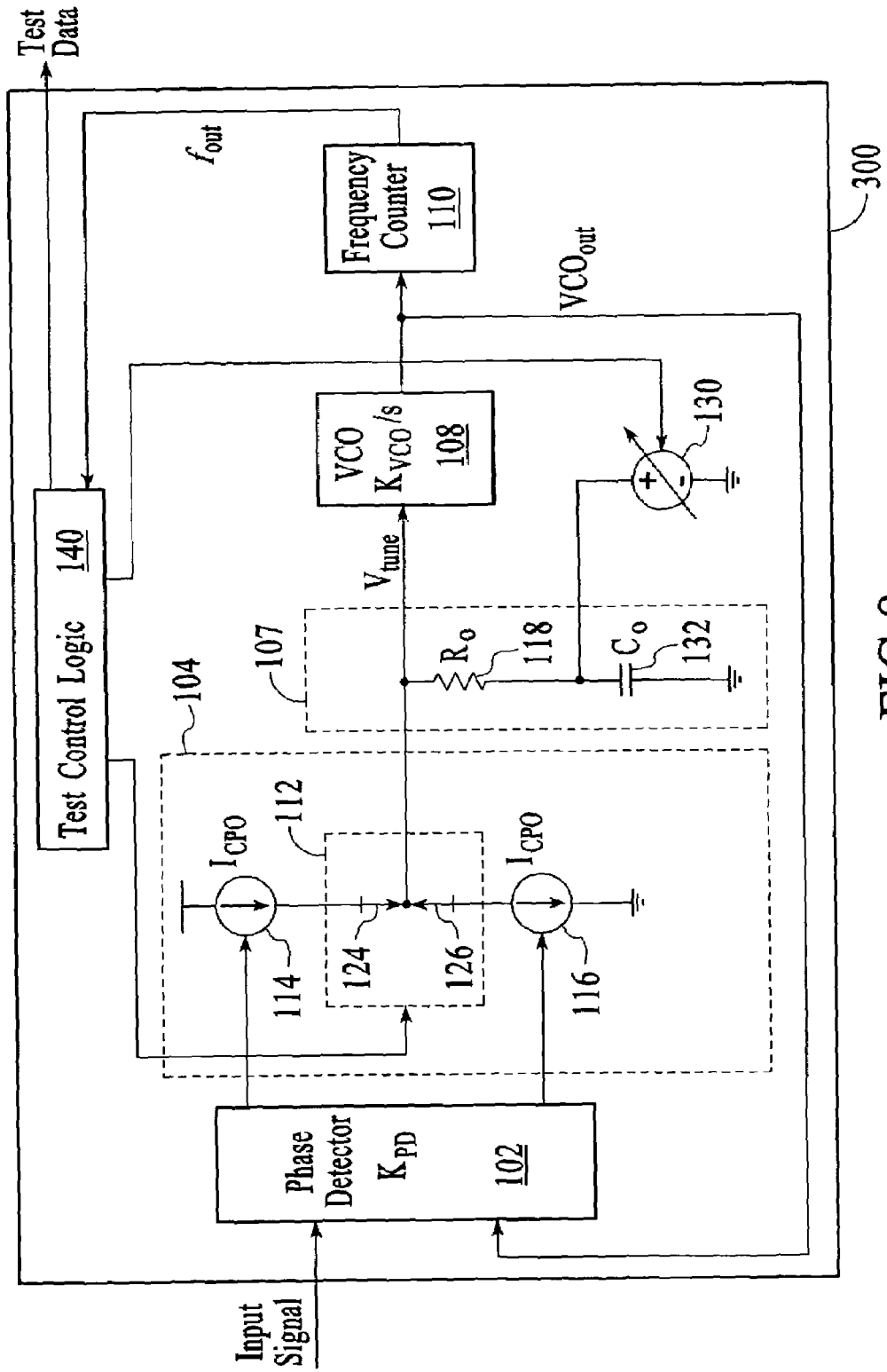
FIG. 8 depicts a PLL IC chip that includes a monolithically integrated charge current switch system and frequency counter in accordance with an embodiment of the invention.

Whether the PLL is first order or second order, the charge current switch system 112 and the frequency counter 110 can be monolithically integrated with the PLL circuitry. FIG. 8 depicts a PLL integrated circuit (IC) chip 300 that includes a charge current switch system 112, a frequency counter 110, a voltage controller 130, and test control logic 140 that are monolithically integrated with a PLL. In the embodiment of FIG. 8, the test control logic controls the charge current switch system and the voltage controller to produce the up and down frequency measurements and the steady state condition as described above with reference to FIGS. 2 and 3 and FIGS. 5–7. The test control logic also receives the up and down frequency measurements from the frequency counter and uses the measurements to solve equation (9). Test data that is generated in response to the frequency measurements can be output off-chip through, for example, the test control logic. In an alternative embodiment, the test control logic is located off-chip, for example, in an external computer system.

Figure 9:
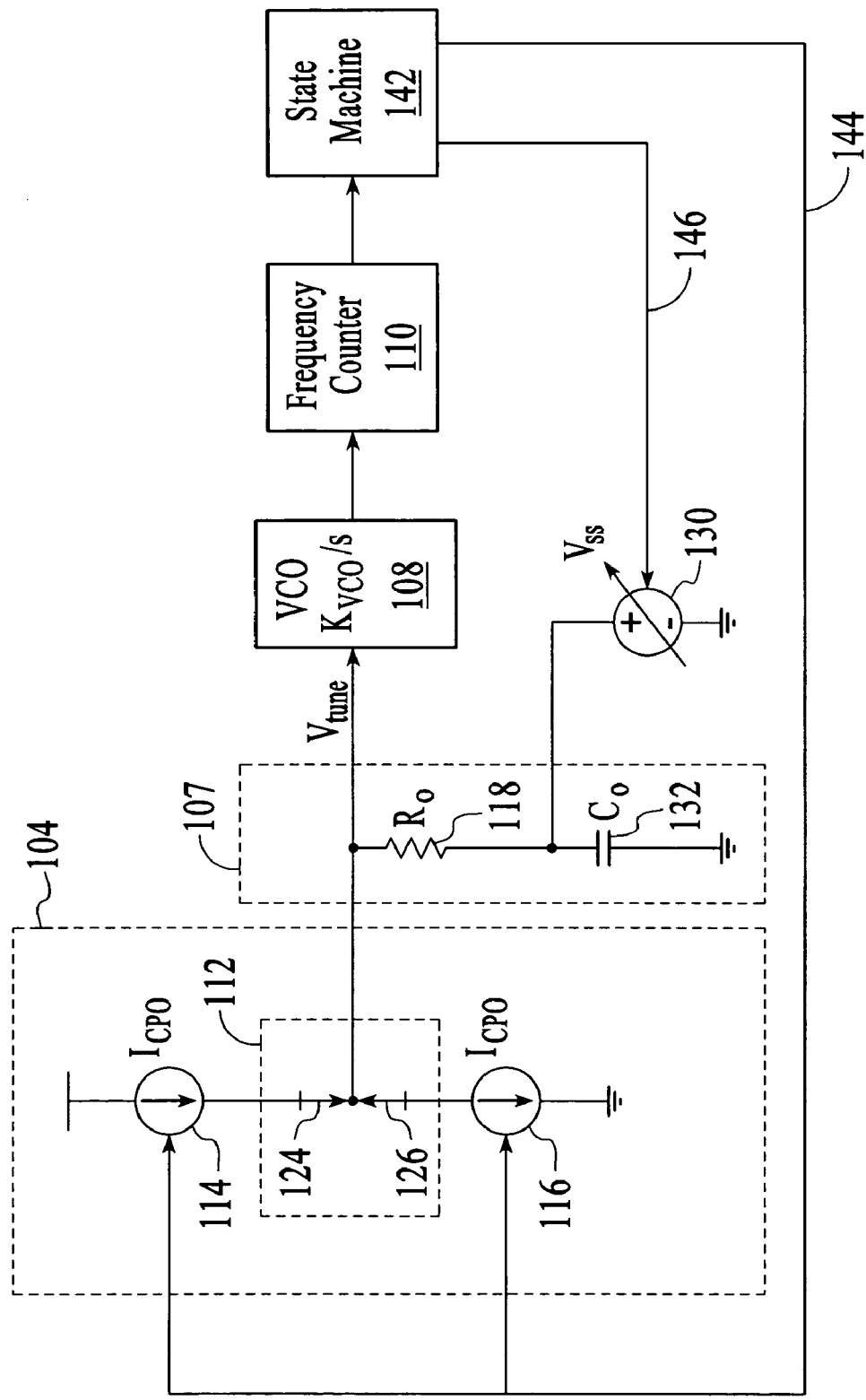
FIG. 9 depicts a portion of the PLL from FIG. 4 that includes a state machine configured to adjust the 3 dB frequency bandwidth of the PLL in response to measurements of the 3 dB frequency bandwidth.

Once the 3 dB frequency bandwidth of a PLL is measured, it can be adjusted to a different 3 dB frequency bandwidth in response to the measurement. The 3 dB frequency bandwidth is proportional to the applied charging current, the resistance ($R_0$) of the loop filter, and the gain ($K_{VCO}$) of the VCO. Of these parameters, the charging current can be adjusted relatively easily. FIG. 9 depicts a portion of the PLL 200 from FIG. 4 that includes a mechanism to adjust the 3 dB frequency bandwidth of the PLL in response to measurements of the 3 dB frequency bandwidth. In particular, the system of FIG. 9 includes a charge current switch system 112, a frequency counter 110, a state machine 142, and control signal paths 144 and 146 between the state machine and the up charge current source 114, the down charge current source 116, and the voltage controller 130. In one embodiment, the center frequency of the VCO 108 is set to a desired steady state frequency by opening the up and down switches 124 and 126 of the charge current switch system and adjusting the VCO tuning voltage through the voltage controller in response to signals from the state machine. Once the steady state frequency is established, the up and down frequencies are measured as described above with reference to FIGS. 6 and 7. In response to the frequency measurements, the state machine iteratively adjusts the up and down charging currents until the 3 dB frequency bandwidth is within a desired range. The charge pump currents can be iteratively adjusted until the below expression is within an acceptable range.

$$f_{up} - f_{dn} = \frac{4\pi f_{3dB,desired}}{DF} \quad (18)$$

where $f_{3\ dB,desired}$ is the desired 3 dB frequency bandwidth. Although the 3 dB frequency bandwidth is adjusted through changing the charge current, other techniques for adjusting the 3 dB bandwidth in response to the frequency measurements are possible.

Figure 10:
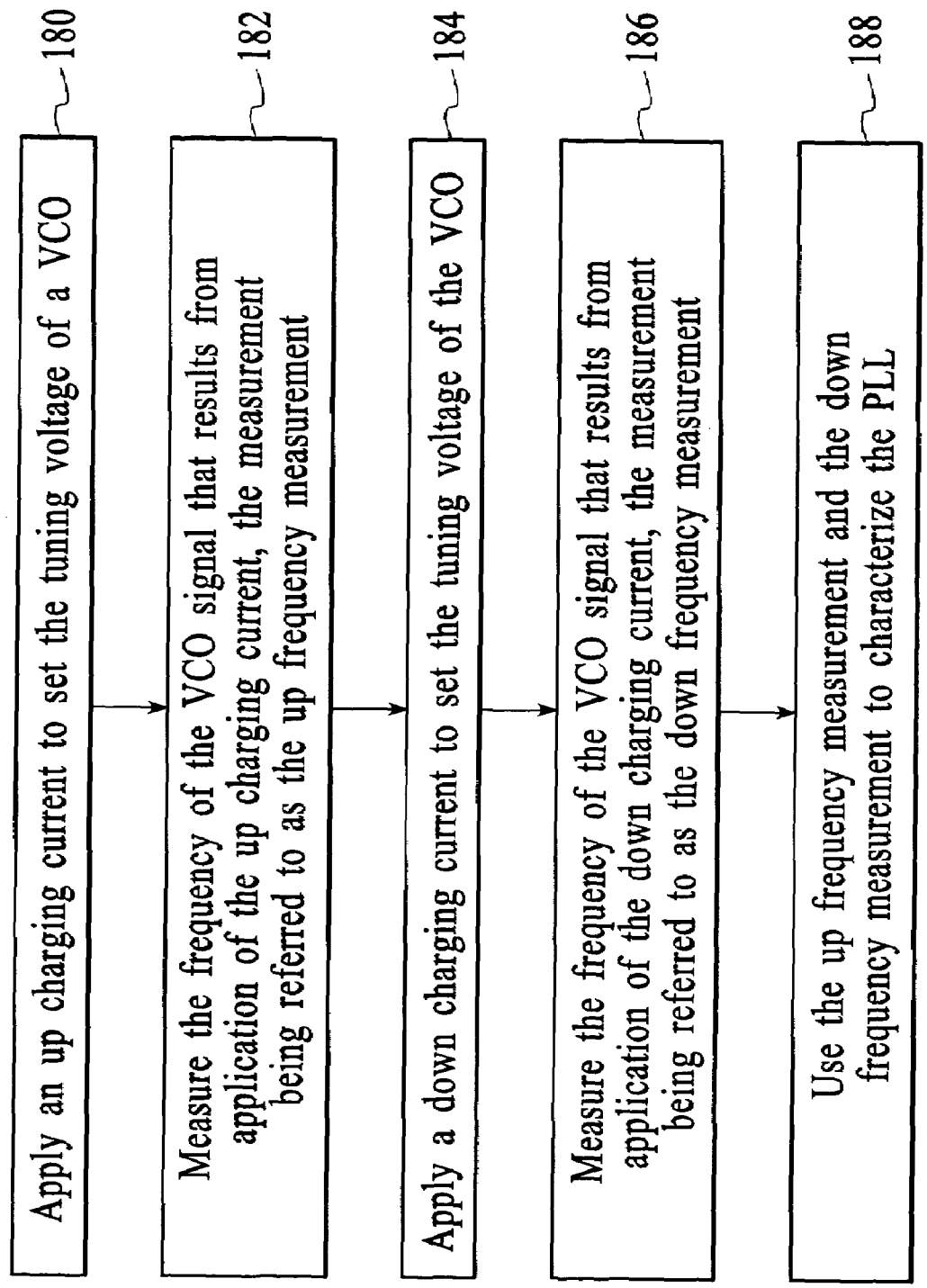
FIG. 10 is a process flow diagram of a method for characterizing a PLL in accordance with an embodiment of the invention.

FIG. 10 is a process flow diagram of a method for characterizing a phase-locked loop in accordance with an embodiment of the invention. At block 180, an up charging current is applied to set the tuning voltage of a VCO. At block 182, the frequency of the VCO signal that results from application of the up charging current is measured, the measurement being referred to as the up frequency measurement. At block 184, a down charging current is applied to set the tuning voltage of the VCO. At block 186, the frequency of the VCO signal that results from application of the down charging current is measured, the measurement being referred to as the down frequency measurement. At 188, the up frequency measurement and the down frequency measurement are used to characterize the PLL.

Although the technique for measuring the 3 dB frequency bandwidth is described with reference to a PLL with a charge pump, the technique can be applied to PLLs that do not use a charge pump. For example, the technique would involve temporarily breaking the feedback loop of the PLL, applying up and down VCO tuning signals to the VCO that are proportional to the signal expected for $2\pi$ radians of phase error while the feedback loop is broken, measuring the resulting up and down frequencies, and using the frequency measurements to calculate the 3 dB frequency bandwidth of the PLL. In another embodiment, the phase detector may be forced to drive the VCO tuning voltage ($V_{tune}$) to maximum and minimum values so that the up and down frequencies ($f_{up}$ and $f_{down}$) can be measured.

Although specific embodiments in accordance with the invention have been described and illustrated, the invention is not limited to the specific forms and arrangements of parts so described and illustrated. The invention is limited only by the claims.

What is claimed is:

1. A method for characterizing a phase-locked loop (PLL), the method comprising:
    applying an up charging current to set a tuning voltage of a voltage controlled oscillator (VCO);
    measuring a frequency of a VCO signal that results from application of a up charging current, the measurement being referred to as a up frequency measurement;
    applying a down charging current to set the tuning voltage of the VCO;
    measuring the frequency of the VCO signal that results from application of the down charging current, the measurement being referred to as the down frequency measurement; and
    using the up frequency measurement and the down frequency measurement to determine a 3 decibel (dB) frequency bandwidth of the PLL.

2. The method of claim 1 further comprising adjusting the 3 dB frequency bandwidth of the PLL in response to the determination of the 3 dB frequency bandwidth.

3. The method of claim 1 wherein applying the up charging current includes isolating the down charging current from the VCO and wherein applying the down charging current includes isolating the up charging current from the VCO.

4. The method of claim 1 wherein the up charging current is a maximum current in a first direction and the down charging current is a maximum current in a second direction, opposite the first direction.

5. The method of claim 1 further comprising initially adjusting a center frequency of the PLL to a desired center frequency.

6. The method of claim 5 wherein the step of initially adjusting the center frequency of the PLL involves:
    simultaneously disabling the up charging current and the down charging current; and
    adjusting a tuning voltage until the PLL operates at the desired center frequency.

7. The method of claim 1 further including adjusting the up and down charging currents until the loop parameters are within a desired 3 dB bandwidth range.

8. A phase-locked loop (PLL) system, the system comprising:
    a voltage controlled oscillator (VCO) configured to generate a VCO signal;
    a phase detector connected to receive an input signal and the VCO signal;
    a charge pump having an up charge current source and a down charge current source, the charge pump being connected to receive control signals from the phase detector;
    a loop filter connected to provide a VCO tuning voltage to the VCO in response to a charge current from the charge pump; and
    a frequency counter connected to measure the frequency of the VCO signal that is generated by the VCO;
    the charge pump further including a charge current switch system that is configured to separately isolate the up charge current source or the down charge current source from the loop filter.

9. The system of claim 8 wherein the charge current switch system and the frequency counter are monolithically integrated with the PLL system.

10. The system of claim 8 further comprising test control logic configured to control the charge current switch system to separately apply an up charging current and a down charging current to the loop filter.

11. The system of claim 10 wherein the test control logic is further configured to determine the 3 dB frequency bandwidth from frequency measurements made when the up and down charging currents are separately applied to the loop filter.

12. The system of claim 8 further comprising a tuning voltage source in voltage communication with the loop filter and configured to adjust the VCO tuning voltage.

13. The system of claim 12 further comprising test control logic configured to control the tuning voltage source to set a center frequency of the PLL to a desired center frequency.

14. The system of claim 12 further including test control logic configured to:
  simultaneously disable the up charge current source and the down charge current source; and
  adjust the VCO tuning voltage until the VCO signal has a desired center frequency.

15. A method for characterizing a phase-locked loop (PLL) comprising a voltage controlled oscillator (VCO), the method comprising:
  applying a first VCO tuning signal that produces a maximum frequency signal from the VCO;
  measuring the frequency of the VCO signal that results from application of the first VCO tuning signal, the measurement being referred to as the maximum frequency measurement;
  applying a second VCO tuning signal that produces a minimum frequency signal from the VCO;
  measuring the frequency of the VCO signal that results from application of the second VCO tuning signal, the measurement being referred to as the minimum frequency measurement; and
  using the maximum frequency measurement and the minimum frequency measurement to determine a 3 decibel (dB) frequency bandwidth of the PLL.

16. The method of claim 15 wherein applying the first VCO tuning signal involves isolating a second charge current source from the VCO and wherein applying the second VCO tuning signal involves isolating a first charge current source from the VCO.

17. The method of claim 15 further comprising adjusting the 3 dB frequency bandwidth of the PLL in response to the determination of the 3 dB frequency bandwidth.

18. The method of claim 15 further comprising initially adjusting a center frequency of the PLL to a desired center frequency by simultaneously disabling an up charging current and a down charging current and adjusting a capacitor voltage until the PLL operates at the desired center frequency.

19. The method of claim 15 further comprising temporarily breaking the feedback loop of the PLL and applying the first and second VCO tuning signals while the feedback loop is broken.

* * * * *